US009399581B2

(12) United States Patent
Grobert et al.

(10) Patent No.: US 9,399,581 B2
(45) Date of Patent: Jul. 26, 2016

(54) PROCESS FOR PRODUCING TWO-DIMENSIONAL NANOMATERIALS

(71) Applicant: Isis Innovation Limited, Oxford, Oxfordshire (GB)

(72) Inventors: Nicole Grobert, Oxford (GB); Adrian Timothy Murdock, Oxford (GB); Antal Adolf Koós, Oxford (GB)

(73) Assignee: Isis Innovation Limited, Oxfordshire (GB)

( * ) Notice: Subject to any disclaimer, the term of this patent is extended or adjusted under 35 U.S.C. 154(b) by 0 days.

(21) Appl. No.: 14/389,447

(22) PCT Filed: Mar. 28, 2013

(86) PCT No.: PCT/GB2013/050828
§ 371 (c)(1),
(2) Date: Sep. 30, 2014

(87) PCT Pub. No.: WO2013/144640
PCT Pub. Date: Oct. 3, 2013

(65) Prior Publication Data
US 2015/0064098 A1      Mar. 5, 2015

Related U.S. Application Data

(60) Provisional application No. 61/789,702, filed on Mar. 15, 2013.

(30) Foreign Application Priority Data

Mar. 30, 2012   (GB) .................................. 1205801.2

(51) Int. Cl.
*C01B 31/04* (2006.01)
*C30B 25/16* (2006.01)
(Continued)

(52) U.S. Cl.
CPC ............. *C01B 31/0461* (2013.01); *B82Y 30/00* (2013.01); *B82Y 40/00* (2013.01); *C01B 31/0438* (2013.01);
(Continued)

(58) Field of Classification Search
CPC   C01B 31/04; C01B 31/0407; C01B 31/0415; C01B 2204/00; C01B 2204/02; C01B 2204/04; C01B 2204/06; C01B 2204/065; C01B 2204/20; C01B 2204/22; C01B 2204/24; C01B 2204/28; C01B 2204/30; C01B 2204/32
USPC ........................................................ 423/448
See application file for complete search history.

(56) References Cited

U.S. PATENT DOCUMENTS

2009/0011204 A1   1/2009   Wang et al.
2009/0047520 A1   2/2009   Lee et al.
(Continued)

FOREIGN PATENT DOCUMENTS

| CN | 102337513 A | 2/2012 |
| WO | 2011/105530 A1 | 9/2011 |
| WO | 2012/031238 A2 | 3/2012 |

OTHER PUBLICATIONS

Wood, et al., Effects of Polycrystalline Cu Substrate on Graphene Growth by Chemical Vapor Deposition, Nano Lett. 2011; 11: 4547-4554.*

(Continued)

*Primary Examiner* — Daniel C McCracken
(74) *Attorney, Agent, or Firm* — Hodgson Russ LLP

(57) ABSTRACT

The present invention provides a process for producing a two-dimensional nanomaterial by chemical vapor deposition (CVD), the process comprising contacting a substrate in a reaction chamber with a first flow which contains hydrogen and a second flow which contains a precursor for said material, wherein the contacting takes place under conditions such that the precursor reacts in the chamber to form said material on a surface of the substrate, wherein the ratio of the flow rate of the first flow to the flow rate of the second flow is at least 5:1. Two-dimensional nanomaterials obtainable by said process are also provided, as well as devices comprising said nanomaterials.

13 Claims, 6 Drawing Sheets

(51) Int. Cl.
  *C30B 29/02* (2006.01)
  *C30B 25/18* (2006.01)
  *B82Y 40/00* (2011.01)
  *C23C 16/26* (2006.01)
  *B82Y 30/00* (2011.01)

(52) U.S. Cl.
  CPC ............ *C01B 31/0453* (2013.01); *C23C 16/26* (2013.01); *C30B 25/165* (2013.01); *C30B 25/186* (2013.01); *C30B 29/02* (2013.01); *C01B 2204/02* (2013.01); *C01B 2204/04* (2013.01); *C01P 2004/20* (2013.01)

(56) References Cited

U.S. PATENT DOCUMENTS

| | | |
|---|---|---|
| 2009/0155561 A1 | 6/2009 | Choi et al. |
| 2011/0046026 A1 | 2/2011 | Ziao et al. |
| 2011/0091647 A1 | 4/2011 | Colombo et al. |
| 2013/0052121 A1 | 2/2013 | Hasegawa et al. |

OTHER PUBLICATIONS

Ishihara, et al., Direct evidence of advantage of Cu(111) for graphene synthesis by using Raman mapping and electron backscatter diffraction, Materials Letters 2011; 65: 2864-2867.*

Wofford, et al., Graphene Islands on Cu Foils: The Interplay between Shape, Orientation, and Defects, Nano Lett. 2010; 10: 4890-4896.*

Yu, Q., et al., Control and characterization of individual grains and grain boundaries in graphene grown by chemical vapour deposition, Nature Materials, vol. 10, No. 6, May 8, 2011, pp. 443-449.

Luo, Z., et al., Growth Mechanism of Hexagonal-Shape Graphene Flakes with Zigzag Edges, ACS NANO, vol. 5, No. 11, Oct. 15, 2011, pp. 9154-9160.

Tapaszto et al., Mapping the electronic properties of individual graphene grain boundaries, Appl. Phys. Lett., 2012, pp. 1-4, vol. 100, 053114.

Banhart et al., Structural Defects in Graphene, ACS Nano, 2011, pp. 26-41, vol. 5, No. 1.

Wood et al., Effects of Polycrystalline Cu Substrate on Graphene Growth by Chemical Vapor Deposition, Nano Lett., 2011, pp. 4547-4554, 11 (11).

Zhao et al., Influence of copper crystal surface on the CVD growth of large area monolayer graphene, Solid State Comms., 2011, pp. 509-513, vol. 151.

Li et al., Large-Area Graphene Single Crystals Grown by Low-Pressure Chemical Vapor Deposition of Methane on Copper, J. Am. Chem. Soc., 2011, pp. 2816-2819, 133 (9).

Reddy et al., High quality, transferrable graphene grown on single crystal Cu(111) thin films on basal-plane sapphire, Appl. Phys. Lett., 2011, pp. 1-3, 98, 113117.

Rasool et al., Continuity of Graphene on Polycrystalline Copper, Nano Lett., 2011, pp. 251-256, vol. 11.

Li et al., Graphene Films with Large Domain Size by a Two-Step Chemical Vapor Deposition Process, Nano Lett., 2010, pp. 4328-4334, 10 (11).

Nie et al., Origin of the mosaicity in graphene grown on Cu(111), Physical Review B, pp. 1-7, 2011, 84, 155425.

Wofford et al., Graphene Islands on Cu Foils: The Interplay between Shape, Orientation, and Defects, Nano Lett., 2010, pp. 4890-4896, vol. 10.

Murdock et al., Controlling the Orientation, Edge Geometry, and Thickness of Chemical Vapor Deposition Graphene, ACS Nano, 2013, pp. 1351-1359, vol. 7, No. 2.

Cho et al., Atomic-Scale Investigation of Graphene Grown on Cu Foil and the Effects on Thermal Annealing, ACS Nano, 2011, pp. A-G.

* cited by examiner

PROCESS FOR PRODUCING TWO-DIMENSIONAL NANOMATERIALS

CROSS-REFERENCE TO RELATED APPLICATIONS

This application claims priority to the application filed Mar. 28, 2013 and assigned PCT/GB2013/050828, which claims priority to the provisional application filed Mar. 15, 2013 and assigned U.S. App. No. 61/789,702 and to the application filed Mar. 30, 2012 and assigned GB App. No. 1205801.2. The disclosures of each are hereby incorporated by reference.

FIELD OF THE INVENTION

This invention relates to a process for producing two-dimensional nanomaterials by chemical vapour deposition (CVD), and to two-dimensional nanomaterials which are obtainable by said process. In particular, the present invention relates to a CVD process for the production of graphene.

BACKGROUND TO THE INVENTION

The physicochemical properties of graphene and other two-dimensional nanomaterials, including the electronic structure, chemical activity and mechanical strength of the materials, are crucially dependent on the edge geometries, grain boundaries and relative crystallographic orientation of the individual constituent single crystal domains. Hence, for the successful implementation of graphene as transparent conducting electrodes or in sensor and nanoelectronic device applications, the generation of graphene with predefined edge geometries and orientation is of essential importance. Despite tremendous efforts, to date the tailored manufacturing of graphene by CVD with controlled domain orientation and defined edge geometries remains unsolved.

Hexagonally shaped graphene domains with defined zigzag edges have been synthesised through atmospheric-pressure CVD (APCVD) (see Yu et al, Nat. Mater. 10, 443-449, 2011; and Luo et al, ACS Nano 5, 9154-9160, 2011). However, these domains are randomly oriented on the substrate, resulting in a mismatch between the relative edge geometry of neighbouring domains. As the individual domains grow and coalesce, structural defects will inevitably be introduced into the film that will degrade the properties of large-area films (see Tapaszto et al, Appl. Phys. Lett. 100, 053114, 2012; and Banhart et al, ACS Nano 5, 26-41, 2011). Moreover, no correlation has been identified between the crystallographic orientation of the graphene network and that of the underlying copper grains. Indeed, some publications suggest that only a weak interaction exists between the copper and graphene (see Yu et al supra; and Rasool et al, Nano Lett. 11, 251-256, 2011). The lack of alignment of graphene domains within a single copper grain, and the invariant shape of domains growing across copper grain boundaries, has led some to suggest that no epitaxial relationship exists between the substrate and graphene layer.

There remains a need in the art for improved processes for the production of two-dimensional nanomaterials, in particular graphene.

SUMMARY OF THE INVENTION

According to a first aspect of the present invention, there is provided a process for producing a two-dimensional nanomaterial by CVD, the process comprising contacting a substrate in a reaction chamber with a first flow which contains hydrogen and a second flow which contains a precursor for said material, wherein the contacting takes place under conditions such that the precursor reacts in the chamber to form said material on a surface of the substrate, wherein the ratio of the flow rate of the first flow to the flow rate of the second flow is at least 5:1.

By conducting a process in accordance with the present invention, it may be possible to control one or more of the structure, crystallographic orientation, edge geometry and thickness of the resulting material. It may even be possible to predict the growth of material on a given substrate. The process described herein is particularly suited to the production of graphene and may allow high quality single and bilayer graphene to be produced, as well as graphene having a controlled orientation or edge geometry. Accordingly, in further aspects the present invention provides graphene and other two-dimensional nanomaterials obtainable by the above process, as well as devices and other products comprising such materials.

DESCRIPTION OF VARIOUS EMBODIMENTS

Figure 1:
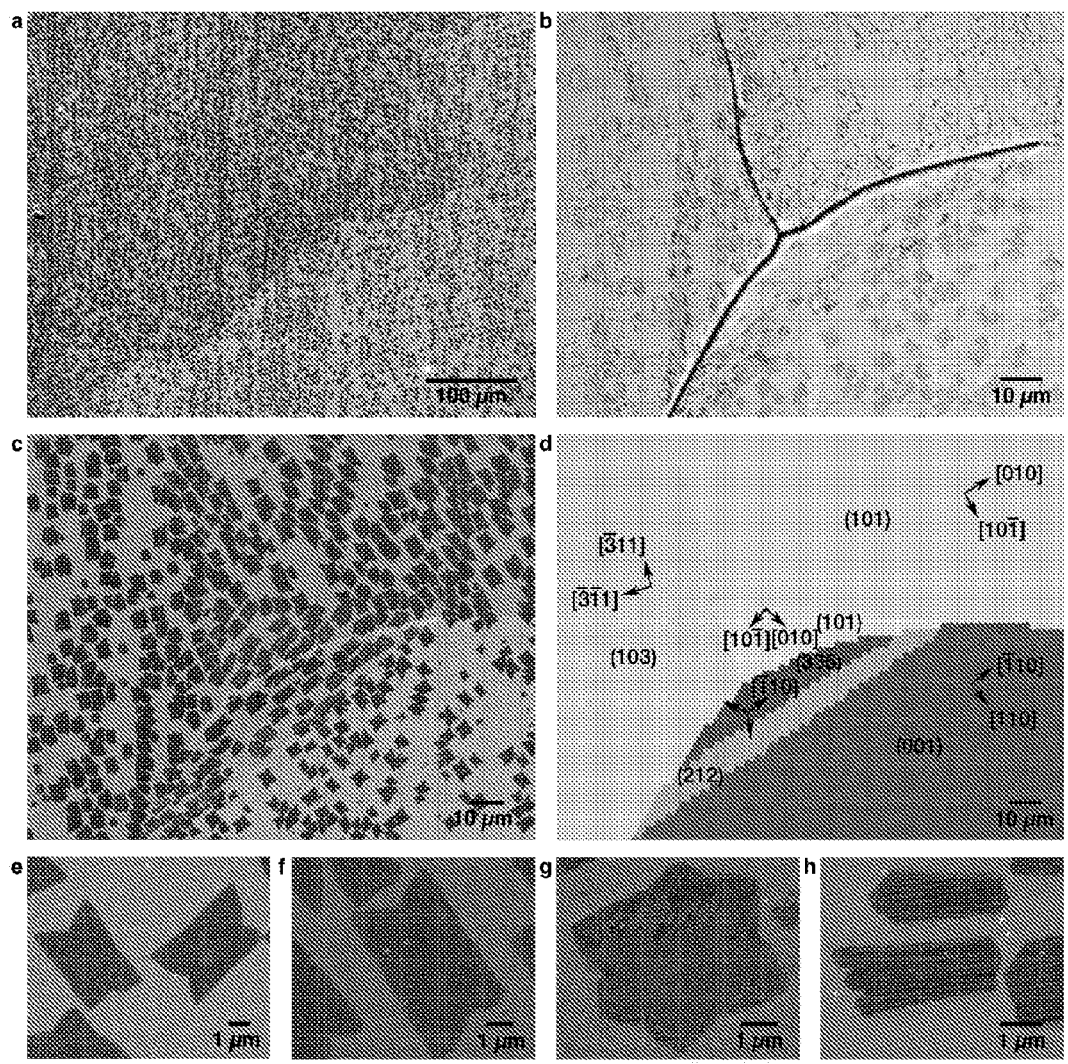
FIG. 1 shows aligned graphene domains on polycrystalline copper. Depicted are: (a) a low magnification SEM image showing variation of domain shape and orientation across the copper foil; and (b), (c) the copper foil as imaged by optical microscopy and SEM respectively. Also shown are: (d) a corresponding inverse pole figure EBSD map illustrating copper crystallographic orientation; and (e), (f), (g), (h) representative SEM images of domains on Cu(001), Cu(101), Cu(103) and Cu(335)/(212)/(769) respectively.

According to the present invention, there is provided a CVD process for producing graphene and other two-dimensional nanomaterials. Two-dimensional nanomaterials generally comprise one or more atomically thin crystalline repeating units referred to as monolayers (or nanosheets). The thickness of a monolayer will depend on the composition of the material. For example, a monolayer of graphene is generally one atom thick, whereas in other materials a monolayer may be formed of sandwiched sheets of atoms. A two-dimensional nanomaterial of the present invention may comprise a single monolayer or a plurality of monolayers stacked together. Where more than one monolayer is present, the monolayers may be weakly bonded by van der Waals interactions. The two-dimensional nanomaterial may comprise from 1 to about 20 monolayers, e.g. from 1 to about 10 monolayers, e.g. from 1 to about 5 monolayers. The two-dimensional nanomaterial may have a thickness ranging from about 0.3 nm to about 10 nm, e.g. from about 0.3 nm to about 5 nm, e.g. from about 0.3 nm to about 2.5 nm. The dimensions of the two-dimensional nanomaterial and the number of monolayers present may be determined using techniques known in the art.

The process of the present invention comprises contacting a substrate in a CVD reaction chamber with a first flow which contains hydrogen and a second flow which contains a precursor for the two-dimensional nanomaterial. The precursor decomposes in the reaction chamber to form a deposit of the two-dimensional nanomaterial on a surface of the substrate. The process described herein is particularly suited to the production of graphene, but it will be appreciated that other two-dimensional nanomaterials may also be produced using the present process.

The first flow is a hydrogen-containing flow, more preferably a substantially pure hydrogen flow, e.g. a pure hydrogen flow. In embodiments, the first flow is introduced into the reaction chamber at a flow rate of 1 sccm or more, 5 sccm or more, 10 sccm or more, 50 sccm or more, 100 sccm or more, 150 sccm or more, 200 sccm or more, 250 sccm or more, 300 sccm or more, 350 sccm or more, 350 sccm or more, 400 sccm or more, 450 sccm or more, or 500 sccm or more. Preferably, the first flow is introduced into the reaction chamber at a flow rate of greater than 100 sccm or more, e.g. 150 sccm or more, 200 sccm or more, 250 sccm or more, 300 sccm or more, 350 sccm or more, 350 sccm or more, 400 sccm or more, 450 sccm or more, or 500 sccm or more.

The second flow comprises a precursor which, under appropriate conditions in the reaction chamber, decomposes to form the two-dimensional nanomaterial on one or more surfaces of the substrate. The precursor may be a gas or a volatile liquid which vaporises in the reaction chamber. For the production of carbonaceous materials such as graphene, the precursor will be a carbon precursor. Suitable carbon precursors include hydrocarbon compounds, for example selected from alkanes (e.g. selected from methane and ethane), alkynes (e.g. acetylene) and volatile liquids such as toluene. In a preferred embodiment, the two-dimensional nanomaterial is graphene and the second flow contains methane. In a particularly preferred embodiment, the second flow consists of a substantially pure methane flow, e.g. a pure methane flow.

In an embodiment, the second flow is introduced into the reaction chamber at a flow rate of 50 sccm or less. In a preferred embodiment, the flow rate of the second flow is less than 20 sccm, e.g. less than 10 sccm, e.g. 5 sccm or less, e.g. 1 sccm or less.

In a process of the present invention, the ratio of the flow rate of the first flow to the flow rate of the second flow is maintained at a value of at least 5:1. In this regard, it has been found that the use of a relatively high flow rate of hydrogen allows aligned graphene domains having well-defined geometries to be obtained, particularly when substantially pure (preferably ≥99.999%) substrates and/or low reaction pressures are employed. Without wishing to be bound by theory, it is believed that the hydrogen flow may preferentially etch edges, e.g. armchair or the zigzag edges, for the graphene domains in the surface of the substrate, allowing graphene to grow in well defined directions. In an embodiment, the ratio of the flow rate of the first flow to the flow rate of the second flow is at least 10:1, e.g. at least 25:1, e.g. at least 50:1, e.g. at least 75:1, e.g. at least 100:1.

The substrate may be a metallic substrate or a non-metallic substrate. The substrate is preferably a metallic substrate comprising one or more planes of metal atoms on one or more surfaces of the substrate. Substrates that promote the breakdown of hydrocarbon gases, but which have low carbon solubility, are especially preferred for use in the present invention, particularly for the production of graphene. The substrate may contain a single metal or a mixture or alloy of two or more metals. The substrate may comprise a metallic layer deposited on a non-metallic substrate, in which case it may be obtained by sputter coating a metal (e.g. copper) onto the non-metallic substrate such as silicon dioxide. In an embodiment, the substrate contains a transition metal. Preferred substrates include copper and platinum substrates. More preferably a copper substrate is used. The substrate may be of any suitable construction, e.g. the substrate may be in the form of a foil. In an embodiment, the substrate is prepared by annealing a substantially pure copper foil for one or more hours, so as to promote formation of a particular crystallographic orientation on a surface of the copper foil.

The substrate is preferably substantially pure. In this regard, it has been found that the purity of the substrate may influence the quality and properties of the graphene and other two-dimensional nanomaterials deposited thereon. Preferably, the purity of the substrate is at least 99.9%, e.g. at least 99.99%, e.g. at least 99.999%. More preferably, a metal substrate, e.g. a copper substrate, having a purity of at least 99.9%, e.g. at least 99.99%, e.g. at least 99.999% is used.

The substrate may be a polycrystalline substrate or a single crystal substrate. In an embodiment, a substrate having a surface which is substantially fully oriented in a single crystallographic orientation is used. By way of illustration, single crystal copper substrates can be produced using techniques known in the art, e.g. by the Czochralski process or the Bridgman process. Alternatively, single crystal surfaces may be obtained by sputter coating a metal (e.g. copper) onto a suitable substrate, e.g. a non-metallic substrate such as silicon dioxide. Single crystal substrates can also be obtained from commercial sources (e.g. from Surface Preparation Laboratory).

It has been found that the crystallographic orientation of the substrate affects the growth, shape, alignment and edge geometry of CVD graphene domains. In particular, it has been found that different shaped graphene domains may grow on specific crystallographic orientations of copper substrates, and that the edges of graphene domains may preferentially align along <110> direction(s) on the surface of the substrate, irrespective of the crystallographic orientation. Moreover, the quality of graphene domains may be dependent on the crystallographic orientation of the substrate, with high quality single layer graphene forming on orientations close to (111) and bilayer graphene forming on (001). Thus, the alignment of the resulting micron sized graphene domains may be dependent upon the atomic scale orientations of the graphene network on various orientations of the substrate. Accordingly, it may be possible to use pre-patterned substrates which allow growth of graphene and other two-dimensional nanomaterials to be controlled. Other metallic or non-metallic substances having a crystalline lattice commensurate with copper (e.g. platinum) may also be utilised in the processes described herein.

In an embodiment, the substrate has a surface having a crystallographic orientation of (111), (001) or (101). Particularly for the production of high quality monolayer graphene, a crystallographic orientation of (111) may be preferred, while a (001) orientation may be preferred for bilayer graphene. Well-oriented parallel domains may be obtained using a crystallographic orientation of (101). In an embodiment, at least one edge of the two-dimensional nanomaterial (e.g. graphene) is oriented substantially parallel to a <110> direction on a crystallographic orientation on a surface of the substrate. In these instances, the crystallographic orientation at said surface will normally be (101), (001) or (111). Crystallographic orientations and directions may be determined using a suitable technique known in the art. For example, electron backscatter diffraction (EBSD) may be used.

In an embodiment, the two-dimensional nanomaterial is produced by atmospheric-pressure chemical vapour deposition (APCVD). That is, the CVD process is performed at a pressure that is substantially equal to (e.g. equal to) atmospheric pressure. In an embodiment, the flows and the substrate are contacted under a pressure within the reaction chamber of about 1 bar, e.g. a pressure of 1 bar.

In an embodiment, the two-dimensional nanomaterial is produced by low-pressure chemical vapour deposition (LPCVD). Thus, the CVD process may be performed at a pressure below atmospheric pressure. In an embodiment, the flows and the substrate are contacted in the reaction chamber at a pressure of less than about 1 bar.

More preferably, the flows and the substrate are contacted in the reaction chamber at a pressure of less than 1 bar. In a particular embodiment, the contacting takes place at a pressure of less than 50 Torr, e.g. less than 10 Torr, e.g. less than 5 Torr, e.g. less than 1 Torr, e.g. less than 0.1 Torr, e.g. less than 0.01 Torr.

The temperature in the reaction chamber will vary depending on the nature of the substrate and/or the precursor that is used. For instance, the temperature in the reaction chamber may range from about 300° C. to about 1500° C., e.g. from about 600° C. to about 1100° C. Particularly where copper substrates are used, it is preferred that the temperature within the reaction chamber is from about 800° C. to about 1050° C., e.g. from about from about 900° C. to about 1045° C., e.g. about 1035° C. The temperature may be maintained throughout the course of the process or it may be varied.

The process may comprise pre-treating the substrate with hydrogen, so as to clean the surface of the substrate and/or promote grain growth. In this pre-treatment step, a hydrogen flow having a flow rate of greater than 1 sccm may be used, and the hydrogen flow may be the same as the first flow that is employed during the contacting step. The period of pre-treatment may be e.g. 5 hours or less, e.g. 1 hour or less, e.g. 30 minutes or less, e.g. 15 minutes or less. In another embodiment, the substrate is not pre-treated with hydrogen.

The second flow is contacted with the substrate for an appropriate period of time to enable one or more layers of the two-dimensional nanomaterial to form on a surface of the substrate. In an embodiment, the second flow is contacted with the substrate for a period of 60 minutes or less, e.g. 30 minutes or less, e.g. 15 minutes or less, e.g. 1 minute or less.

By way of illustration, and without limitation, the process may be conducted by first evacuating the reaction chamber. For example, the reaction chamber may be evacuated to a base pressure of about 0.1 Torr or less, e.g. about 0.01 Torr or less. The reaction chamber may be optionally purged using an inert gas such as argon or helium. A hydrogen-containing flow may then be introduced into the reaction chamber. The pressure within the reaction chamber is preferably maintained at a value of less than 10 Torr, e.g. less than 5 Torr. The reaction chamber is heated to the desired temperature and, when the desired temperature has been reached, the substrate is introduced into the chamber. The substrate may be introduced directly into the reaction chamber, or it may be placed in quartz tube which is then inserted into the reaction chamber. The hydrogen flow is used to clean the surface of the substrate, increase the grain size of the substrate and promote formation of preferred crystallographic orientations. Once the substrate has been pre-treated, the second flow, which contains the precursor, is introduced into the reaction chamber at the desired flow rate, where it contacts the substrate and decomposes to form graphene on one or more surfaces of the substrate. The ratio of the flow rate of the first flow to the flow rate of the second flow during the course of the reaction is maintained at a value of at least 5:1. Preferably, the second flow is contacted with the substrate for a period of 60 minutes or less, e.g. 30 minutes or less, e.g. 15 minutes or less. The pressure within the reaction chamber is maintained at a value of, for example, about 1 bar (e.g. 1 bar) or below 1 bar (e.g. less than 10 Torr, e.g. less than 5 Torr) during the contacting, and the reaction chamber is maintained at the desired temperature (e.g. a temperature of from about 800° C. to about 1050° C., e.g. from about 900° C. to about 1045° C., e.g. about 1035° C.) during this time. After the two-dimensional nanomaterial has been deposited, the substrate can be quenched by e.g. cooling the substrate in a hydrogen atmosphere. The material may then be separated from the substrate. Various techniques are known in the art for separating layers of two-dimensional nanomaterials from CVD substrates. For example, a poly(methyl methacrylate) (PMMA) transfer process, as illustrated in the Example herein, may be used. Advantageously, the present process may be relatively inexpensive and scalable, and may not require sophisticated equipment.

The present processes may facilitate controlled and orientated growth of two-dimensional nanomaterials, particularly graphene. In this regard, properties such as electronic structure, chemical activity and mechanical strength are dependent on the edge geometries and thickness of graphene, as well as boundaries present and relative orientation between graphene domains. The relative crystallographic orientation of the adjacent grains also has a strong influence on the mechanical, chemical and electronic properties of the grain boundaries. Hence, for the successful implementation of graphene in various applications (e.g. transparent conducting films, nanoelectronic devices, sensors and other devices), the generation of graphene with predefined geometries and orientation is of critical importance.

Graphene and other two-dimensional nanomaterials produced by the present process may have a defined edge geometry. Preferably, the geometry of one or more edges of the graphene is substantially zigzag or substantially armchair. Controlling the edge orientation of the graphene is important with regard to the electronic properties of the material, and may also be beneficial with regard to the growth of graphene nanoribbons. In the latter respect, graphene nanoribbons have been predicted to be metallic if their edges exhibit a zigzag geometry, whereas armchair edges can give rise to either semiconducting or metallic transport.

The present processes may also be used to produce monolayer or bilayer graphene. The term "monolayer" as used herein in connection with graphene refers to a single, atom-thick layer of graphene, whilst the term "bilayer" refers to a graphene structure having two layers of graphene, one overlying the other. Bilayer graphene is particularly important for electronic applications due to its ability to form a band gap. In embodiments, the graphene that is produced by the process comprises at least 50%, e.g. at least 60%, e.g. at least 70%, e.g. at least 80%, e.g. at least 90%, e.g. at least 95% monolayer graphene. In other embodiments, the graphene comprises at least 50%, e.g. at least 60%, e.g. at least 70%, e.g. at least 80%, e.g. at least 90%, e.g. at least 95% bilayer graphene.

The present processes may allow high quality continuous graphene layers comprising oriented single crystals having dimensions of the order of microns, millimeters or even centimeters to be used, and it may be possible to scale up the process to produce graphene having even larger sizes. In this regard, by controlling the alignment of graphene domains as well as the nucleation and nucleation density, it may be possible to synthesise large-area sheets of graphene with minimal defects. Such sheets may have a cross-sectional dimension of the order of millimeters or even centimeters. In some instances, a graphene sheet may have a dimension of at least 1 cm, e.g. at least 10 cm, e.g. at least 1 meter.

The present processes may also be used to produce graphene and other two-dimensional nanomaterials containing one or more dopants. Examples of suitable dopants include nitrogen, boron and silicon.

Two-dimensional nanomaterials produced by the present process may be used in the manufacture of devices and other products. By way of illustration, the device may be an electronic device, e.g. a semiconductor, a transparent conductor, a display (e.g. a flexible display for a computer screen or other visual display unit), a transistor, a photovoltaic cell or a diode.

The following non-limiting Example illustrates the present invention.

EXAMPLE

Experimental

Synthesis of CVD Graphene on Copper Foils

Graphene was synthesised using low-pressure chemical vapour deposition (LPCVD) of $CH_4$ in the presence of $H_2$ on 10× 25 mm 25 μm thick copper foils (99.999%; Alfa Aesar, item no. 10950). The CVD set-up consisted of a quartz tube (20 mm inner-diameter) located inside a horizontal cylindrical furnace and connected to a scroll pump. The Cu substrates were placed inside the quartz tube and kept 10 cm outside the furnace before the system was evacuated to a base pressure of <0.01 Torr, purged with Ar, and backfilled with 500 sccm $H_2$ at 4.1 Torr. Following this, the furnace was heated to 1035° C. and left until the temperature stabilised before the Cu substrates were rapidly heated by shifting them into the hot zone of the furnace. The Cu substrates were kept at 1035° C. for 30 minutes in the presence of 500 sccm $H_2$ in order clean the surface, increase the copper grain size and to promote the formation of preferred crystallographic orientations. Once the substrates were annealed, 5 sccm $CH_4$ was introduced for 1 min without changing the $H_2$ flow in order to grow graphene on the Cu substrate. During the graphene growth the pressure was 4.2 Torr. After the growth period the $CH_4$ was switched off and the substrates were quenched by rapidly shifting out of the hot zone to cool in a hydrogen atmosphere.

Graphene was also synthesised using atmospheric-pressure CVD (APCVD). In these experiments, the scroll pump was replaced with an acetone bubbler. Cu substrates were annealed under 500 sccm $H_2$ for 30 minutes. Following annealing, the $H_2$ flow was decreased to 300 sccm and 5 sccm $CH_4$ was introduced for 15 minutes. Low-purity Cu foils (99.8%, Alfa Aesar, and 99.9%, Goodfellow) were used for investigations following 10 min sonication in acetic acid and rinsing in deionized water, to remove contaminants from surface coatings applied by suppliers.

Transfer of Graphene Samples

Graphene samples were transferred using a poly(methyl methacrylate) (PMMA) assisted procedure. PMMA ($M_w$ ~996,000) was dissolved in chlorobenzene at 120° C. The PMMA solution (20 mg/mL) was drop-coated onto the graphene-covered copper substrates and then cured in an oven at 160° C. for 1 minute. Samples were floated on ~0.2 g/mL $FeNO_3$ overnight to etch away the copper substrate, leaving PMMA/graphene samples floating on the liquid's surface. The etching solution was replaced with deionised water and the PMMA/graphene samples were transferred onto the target substrate (TEM grid, 300 nm $SiO_2$/Si). The PMMA was dissolved using warm acetone leaving graphene on the target substrate. Graphene coated substrates were heated to 180° C. in a vacuum oven for 60 minutes to aid the removal of residual PMMA from the surface.

Characterisation of Samples

Samples were characterised by scanning electron microscopy (SEM), electron backscatter diffraction (EBSD), transmission electron microscopy (TEM) and selected area electron diffraction (SAED), Raman spectroscopy and optical microscopy. A JEOL JSM-6500F was operated at 5 kV for SEM imaging, and 15 KV for EBSD measurements taken with 2 micron step size. TEM and SAED were conducted on a JEOL 2010 TEM operated at 200 kV. The rotation between the TEM images and corresponding SAED patterns was calibrated using molybdenum trioxide crystals. HRTEM was conducted on a Titan G2 60-300 operated at 80 kV. A Renishaw inVia Raman spectrometer equipped with a 532 nm laser, 2400 l/mm grating, was used to collect Raman data from graphene on the copper surface using Streamline High Resolution imaging mode. Optical microscopy was conducted using a Reichert Polyvar MET optical microscope.

Computational Modelling

The standard Kohn-Sham self-consistent density functional theory (DFT) was applied to local density approximation calculations by means of the SIESTA code. Core electrons were replaced by norm-conserving pseudopotentials in the fully nonlocal Kleinman-Bylander form and the basis set was a general and flexible linear combination of numerical atomic orbitals constructed from the eigenstates of the atomic pseudopotentials. The nonlocal partial core exchange correlation correction was included for Cu to improve the description of the core valence interactions. An auxiliary real space grid equivalent to a plane-wave cutoff of 100 Ry was used.

Cu surfaces are simulated by two infinite five-layer of (4×4) and (6×4) unit cells corresponding to slabs parallel to the (001) and (110) fcc planes, thus resulting in systems having 188 and 148 atoms, respectively. Each system was sampled with 4 (2×2×1) in-plane k-points and a vacuum of 20 Å. For the graphene sheet, a rectangular C28 cluster consisting of zigzag and armchair edges was used. During the geometry optimizations, all atoms were relaxed, except the latest two layers that were kept fixed, thus mimicking the bulk positions. All calculations were performed within the spin-polarized frame.

Results and Discussion

A short synthesis time was selected so that domain growth and evolution was halted before full-scale coverage was achieved. This enabled investigations to be conducted into the variation of the shape and orientation of individual graphene domains prior to significant coalescence. SEM (FIG. 1a) and optical microscopy (FIG. 1b) illustrates that isolated graphene domains grow across the copper substrate, with the graphene contrast varying between different copper grains. Grain boundaries of the copper are identifiable in the images, with a triple point located at the centre and a twin running diagonally across the image. Graphene domains commonly appear as dark shapes on the copper substrate, though on some copper grains the contrast reverses and domains appear pale against the substrate. The optical microscopy illustrates that the graphene domains grow unimpeded over (i) the striations due to cold rolling of the foils, (ii) terraces of the copper substrate surface, (iii) grain boundaries of the polycrystalline copper substrate. SEM of this region, shown in FIG. 1c, provides the opportunity for detailed analysis of the shape and alignment of the graphene domains. The graphene domains appear with darker contrast against the copper substrate, while different copper grains can be identified due to contrast emerging from electron channeling effects. Various shaped graphene domains can be identified in FIG. 1c, including 4-lobed domains that incorporate two parallel sides (FIG. 1e and FIG. 1f), 6-lobed star-shaped domains (FIG. 1g) and rectangular domains with hexagonal ends (FIG. 1h). While the 4-lobed domains are similar to those previously reported, the presence of parallel edges on these domains indicates that different factors are contributing to the domain growth. On closer inspection it is apparent that neighbouring domains frequently have edges that are aligned along a specific direction, and that this direction often changes across copper grain boundaries. To further investigate this alignment, the crystallographic orientation of the underlying polycrystalline copper was analysed using EBSD with the aim of correlating the graphene domain shape and alignment to the atomic structure of the substrate.

The representative inverse pole figure EBSD map for the region displayed in FIG. 1a, FIG. 1b and FIG. 1c is shown in FIG. 1d. The map depicts the normal direction crystallographic orientation of the copper substrate using the standard colour key, with miller indices listing the closest low index orientation of each constituent grain (more accurate crystallographic orientation can be obtained by overlaying unit cubes and projections of <110> on this map; not shown). Comparing FIG. 1c and FIG. 1d it can be seen that: (i) 4-lobed graphene domains exhibiting two parallel sides are found on the (001) and (101) orientated surface, (ii) rectangular graphene domains with hexagonal ends are found on (335) and (212) orientated surfaces, and (iii) six-lobed stars-shaped domains are found on the (103) orientated surface. The edge alignment of domains can be investigated by viewing the in-plane horizontal crystallographic orientation of the copper, represented with vectors for noteworthy grains in FIG. 1d (and more accurately by the associated inverse pole figure map; not shown). From these vectors it can be concluded that graphene domains possessing a straight edge will align parallel to a direction within the family <110>.

Figure 2:
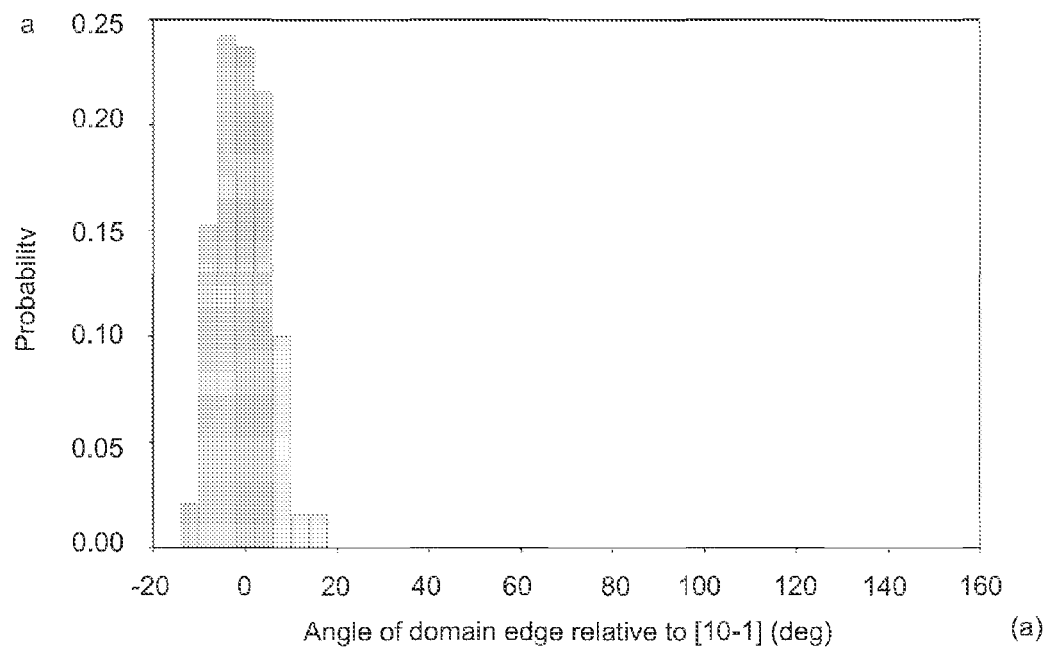
FIG. 2 shows the distribution of the edge angle of graphene domains on (a) (101) and (b) (001) orientated copper.
Figure 2:
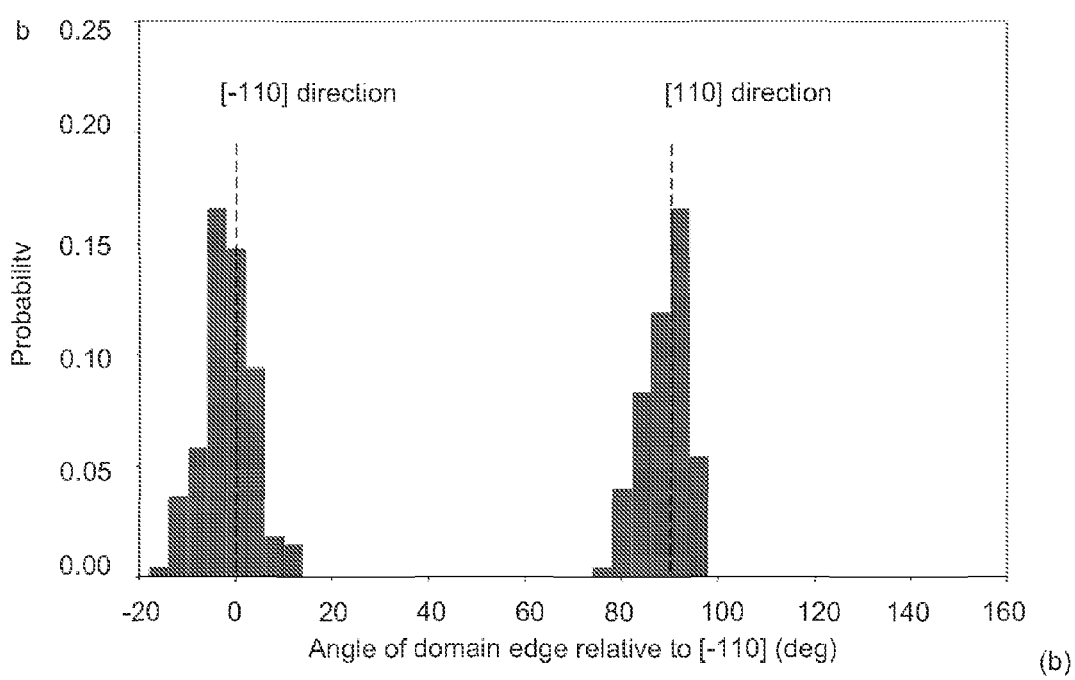

For the (101) orientated surface such alignment is possible along only one direction, [10-1], as indicated by the axes in FIG. 1d for the upper right, spring-green coloured grain. By drawing comparisons with the SEM image of the equivalent region in FIG. 1c it is apparent that a single alignment of four-lobed domains with parallel edges occurs with the [10-1] direction. Measurement of the angle of orientation for the straightest edge, of over 150 graphene domains, shows a clear distribution centred around the [10-1] direction, with the average edge alignment only 2.3° misaligned with a standard deviation of 5.7° as displayed in FIG. 2a. A second copper grain also exhibits (101) orientation in Figure c and is located in the centre of the image. The two (101) grains possess a relative in-plane misorientation of 68°, which can be confirmed by comparing the two axes. As a consequence, the graphene domains are also misaligned between these two copper grains by an equivalent degree of rotation in order to maintain alignment with the [10-1] direction on the respective grains. Graphene domains can also be observed to have grown across the grain boundary between these two misorientated (101) grains, and subsequently the edge of the graphene domains abruptly bend to align to the [10-1] direction of both grains. This illustrates that while graphene may grow on two different surfaces that possess (near-)identical crystallographic orientation and consequently (near-)identical atomic surface structure, the edge alignment of the graphene that forms is directly related to the orientation of the surface atomic configuration of the copper unit cell, and not solely the crystallographic packing. This provides evidence that the hexagonal graphene network preferentially orientates along a specific atomic packing of the copper substrate, namely the <110>, presumably to minimise the energy of the system.

For the (001) orientation there are two possible <110> directions, [-110] and [110], as illustrated by the axes for the lower right, red coloured grain in FIG. 1d. By comparison with the SEM image of the corresponding region in FIG. 1c, it is observed that the parallel edges of the 4-lobed graphene domains align to either the [110] or [-110] direction in the great majority of cases. To provide further insight, the angle of orientation of the straightest edge was again measured, in this instance for nearly 300 graphene domains. The results are telling, with a bimodal distribution as the edge alignments are divided between the two possible orientations with 53% of domains showing a distribution around the [-110] direction and 47% around the [110] direction. For the domains aligned to the [-110] direction, the average edge alignment is only 4° misaligned (with a standard deviation of 5°), and for the [110] direction the average edge alignment is 3° misaligned (with a standard deviation of 4°), as displayed in FIG. 2b. This analysis shows that on (001) orientated copper the edges of the graphene domains align to two preferential directions, [110] and [-110], which is distinctly different to the single edge alignment observed for domains on the (101) orientation.

The copper (111) orientation is recognised as a promising surface for graphene growth, primarily due to the correlation between the hexagonal graphene network and fcc(111) surface. In the present experiments, the (335) and (212) orientations at the centre of FIG. 1d were found to be the closest to (111) orientation, both being ~13° misaligned, as confirmed by EBSD. Consequently, both orientations are stepped surfaces, with distinct (111) terraces and repeated lattice steps running parallel to the [1-10] direction compensating for the misalignment. Rectangular graphene domains on the (335) and (212) surface have length edge orientations parallel to the [1-10] direction, indicating the influence of the terrace and lattice steps on the growth of the domains. The hexagonal ends orient to the component of <110> within the lattice plane, for example [0-35] and [30-5] for the (335) orientation. Further investigations were conducted on a grain with (769) orientation, which is only 9.4° misaligned from (111). This grain also showed rectangular domains, with long edges again parallel to the lattice steps in the [1-10] direction. Interestingly, the ends of domains on this grain clearly showed hexagonal shaped termination, illustrating that while terrace steps may promote the elongation of domains, the correlation between the hexagonal graphene network and the fcc(111) network shows a preference for edges parallel to the <110> direction.

When compared with the well-aligned domains previously discussed, the 6-lobe graphene on the orange (103) orientation displays only minor edge alignment corresponding to the [−311] direction. The (103) orientation is again a stepped surface; however in this case the surface of the terraces shows (001) atomic structure and lattice steps parallel to the (010) direction. Consequently, a number of competing factors can influence domain growth, such as (i) the preference for edge alignment to the (110) and (1-10) direction on the (001) terraces, corresponding to the (−311) direction on the surface; (ii) preferential growth along terraces and parallel to the steps, in the (010) direction; and (iii) growth dictated by the six-fold symmetrical graphene network. The observation of 6-lobe domains with little edge alignment shows that growth on the (103) orientation must be dictated by a combination of factors. These observations also suggest that the substrate is less influential on the (103) orientation compared to the (101) surface where edge orientation was clearly identified.

Additional regions compared by SEM and EBSD indicated that these correlations between the shape of the graphene domains and the copper crystallographic orientation are repeated on many different copper grains across the entire substrate surface. However, graphene domains are also seen to align due to topographical features. One such occurrence is present in the (103) domain, where a cold rolling striation runs vertically through the grain and has led to increased nucleation and growth of graphene domains. Further examples of alignment along mechanical processing lines, and other surface defects, were found.

Figure 3:
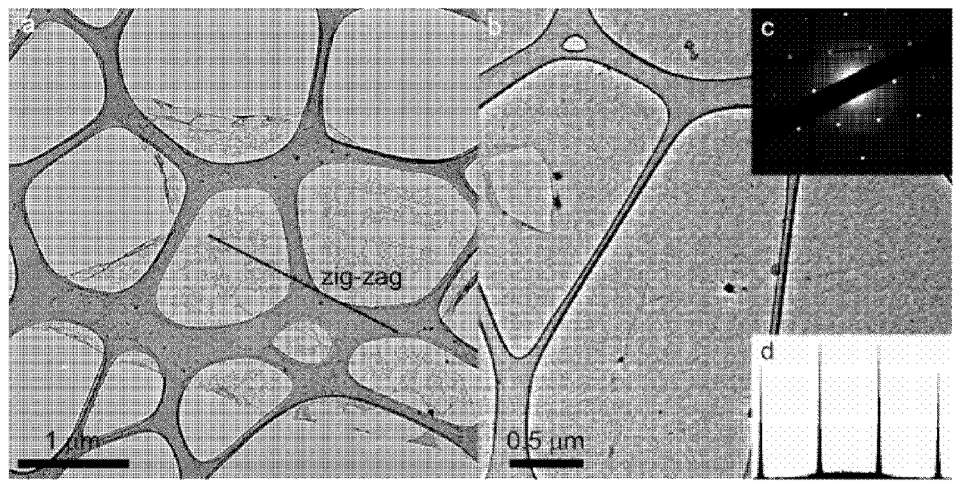
FIG. 3 shows: a) a TEM image of a graphene domain (the zigzag orientation of the long axis was determined from electron diffraction); b) a TEM image of a graphene domain with insets showing: c) the electron diffraction pattern; and d) line profile across the electron diffraction pattern.

TEM and SAED were utilised to determine the geometry of the aligned edges of the graphene domains. FIG. 3a shows a TEM image of a graphene domain transferred onto a TEM grid covered by amorphous carbon film. The domain is identified as originating from the (001) orientation as (i) it exhibits the characteristic 4-lobed shape incorporating two parallel sides; and (ii) it was located on the TEM grid in close proximity to similar domains that were rotated by 90°. The edge orientation of the long axis of the graphene domain can be determined by correlating with the orientation of the SAED pattern. The long axis orientation was found to be zigzag on all domains investigated, and consequently it can be inferred that the two parallel edges of the graphene domain also show zigzag geometry. Since it has been suggested that multi-lobed graphene domains may be composed of several single crystals, SAED was used to determine crystallographic orientation for multiple regions across the domain. SAED patterns did not rotate respective to each, confirming that the domains were single crystals. A representative TEM image of a single layer graphene domain is shown in FIG. 3b together with the SAED pattern recorded at the centre of the image (FIG. 3c) and the line profile across the electron diffraction pattern (FIG. 3d).

Figure 4:
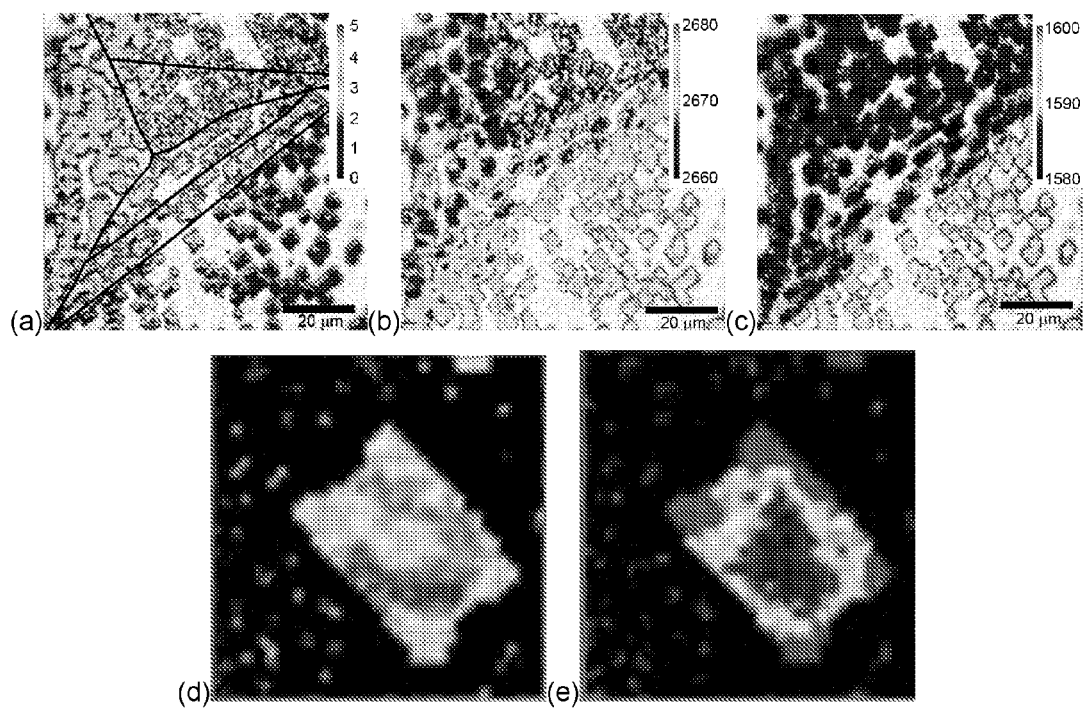
FIG. 4 shows 90×90 μm spatially resolved Raman spectroscopy maps corresponding to FIG. 1. Depicted are the: (a) $Int_{2D}/Int_G$ ratio; (b) the 2D peak position; and (c) the G peak position. Also shown are high resolution maps, 6.5×6.5 μm, of a graphene domain on (001) orientation showing: (d) 2D peak position; and (e) G peak position.

The properties of a graphene specimen are directly related to the number of layers present, with single layer graphene showing optimum transparency and conductivity. As a consequence it is important to accurately determine the number of layers in a sample. Raman spectroscopy offers a non-destructive analysis of the number of layers and quality of a sample. The G peak (located at ~1580 cm$^{-1}$), 2D peak (~2685 cm$^{-1}$) and D peak (~1350 cm$^{-1}$) are key features of the graphene spectrum. Importantly, the ratio between the intensities of the 2D and G peaks, $I_{2D}/I_G$, provides an indication of the number of layers present. If $I_{2D}/I_G>2$ then a sample can be regarded as single layer graphene, if $1<I_{2D}/I_G<2$ then bilayer graphene is present, and if $I_{2D}/I_G<1$ then 3 or more layers are present. The intensity of the D peak provides an indication of the presence of defects in the graphene. FIG. 4 depicts results obtained from high resolution spatially resolved Raman spectroscopy for the region corresponding to FIG. 1. These data illustrate that the quality and number of layers of graphene domains is directly related to the crystallographic orientation of the copper substrate.

FIG. 4a presents a map showing the ratio of $I_{2D}/I_G$. The map illustrates that the ratio varies between ~1-5 across the copper surface, indicating that the sample is primarily composed of single layer graphene. Further comparison of FIG. 4a with Figure c indicates that variations of the Raman intensity ratio are often directly related to the crystallographic orientation of the copper. Graphene domains on (212), (335) and (103) copper orientations all show $I_{2D}/I_G>2$, revealing that single layer graphene is preferentially formed on these crystallographic orientations. In contrast, domains on the (001) orientation show $1<I_{2D}/I_G<2$, representative of bilayer graphene. Domains on (101) show regions with $1<I_{2D}/I_G<2$ as well as regions with $I_{2D}/I_G>2$, indicating that both single and bilayer graphene is formed on this orientation. Notably, graphene domains can be observed to have grown across copper grain boundaries with a correlated change in the ratio value (see the domain located partially on (001) and (212) orientations in FIG. 4a). This suggests that the number of layers in the domain can change across the boundary from single on (212) to bilayer on (001), and that this variation is controlled by the interaction with the underlying copper substrate. These variations of Raman intensity ratio indicate that the crystallographic orientation of the copper substrate has a strong influence on the type of graphene that forms, providing a new avenue for the controlling the synthesis of graphene with a specific numbers of layers, e.g. monolayer or bilayer graphene.

The position of the 2D and G peaks also provides important information about the sample. Substrate-induced doping can cause a shift in the 2D and G peak positions. Electron and hole doping both up-shift the G peak, while the 2D peak is down-shifted by electron doping and up-shifted by hole doping. Tensile and compressive strain introduced into the graphene network can also cause a shift in peak positions; tensile strain causes a down-shift of both the 2D and G peaks, while compressive strain causes an up-shift. FIG. 4b and FIG. 4c present maps of the 2D and G peak position respectively.

A more detailed examination of a single graphene domain on the (001) orientation is presented in FIG. 4d and FIG. 4e. Distinct variations can be observed with the G and 2D peak positions increasing at the tips of the four lobes of the domain, regions that correspond to the growth front of the graphene domain. This variation could be due to increased oxygen intercalation, or variations in the localised strain of the graphene domain at these regions, compared to the centre of the domain. While attempts were made to map the intensity of the D peak across the entire region depicted in FIG. 4a, and with high resolution scanning across the single graphene domain in FIG. 4d, it is noteworthy that the D peak was invariably absent. This indicates that the graphene domains were of the highest quality with minimal defects. The absence of the D peak also suggests that the domains are single crystallites, as grain boundaries between misorientated domains within a polycrystalline domain produce a detectable D peak.

Computational modelling provides further insights into the orientation of graphene domains with specific crystallographic orientations of the copper substrate. The three low index orientations, (110), (001) and (111) were investigated (see FIG. 5 a, b and c respectively), with each surface displaying a distinct atomic structure. The Cu(110) surface is a rectangular lattice with lattice parameter z, Cu(001) is square lattice with a lattice parameter y, and Cu(111) is hexagonal, with lattice parameter x. As a consequence, the three surfaces will show varying affinity for the hexagonal graphene network.

Figure 5:
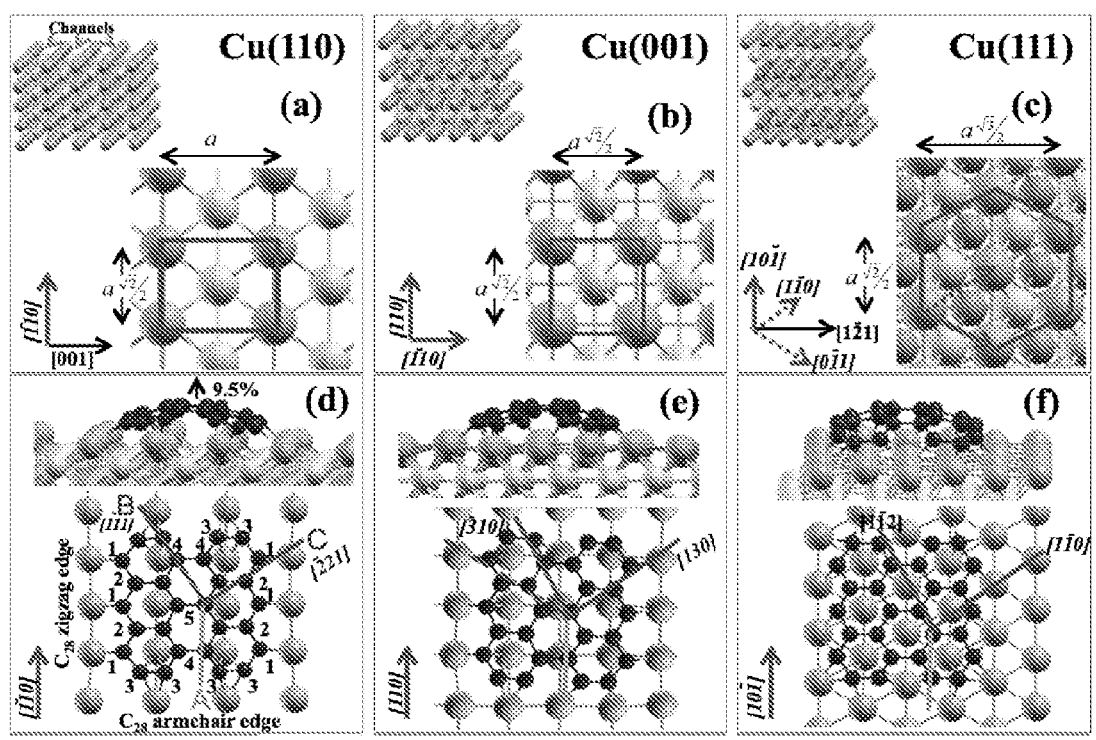
FIG. 5 shows the side and top views of the Cu (110), (001) and (111) orientations. The different stacking sequences are shown as shaded spheres indicating the available adatom or adlayer sites.

The side and top views of each orientation are shown in FIG. 5 a, b and c; the different stacking sequences are shown with coloured spheres indicating the available adatom or adlayer sites. The (110) surface, which is the most open face, exhibits "channels" that are prone for deposition in the [−110] direction. The (001) surface has fourfold symmetry with two structurally equivalent [110] and [1-10] directions. The (111) surface has sixfold symmetry, with structurally equivalent [10-1], [1-10] and [0-11] directions.

Figure 6:
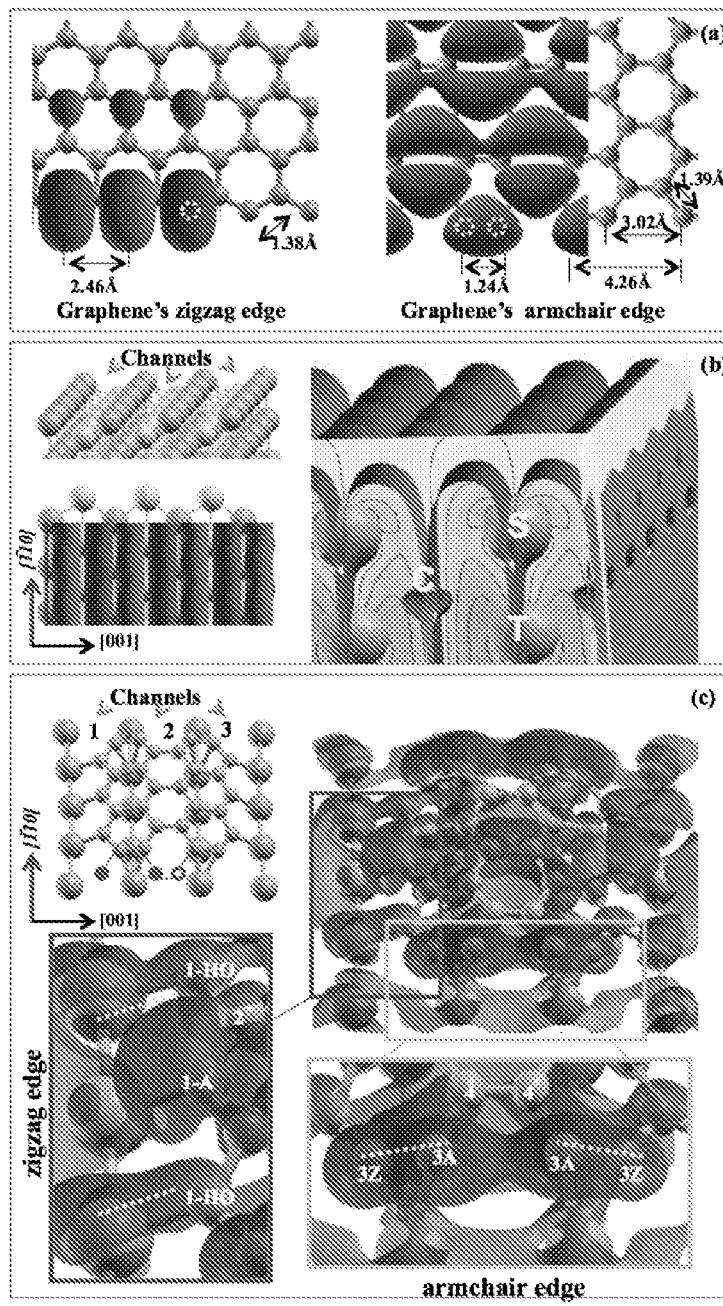
FIG. 6 depicts the calculated relaxed configurations of both zigzag and armchair edged freestanding graphene systems.

FIG. 6 depicts the calculated relaxed configurations of both zigzag and armchair edged freestanding graphene systems.

Figure 7:
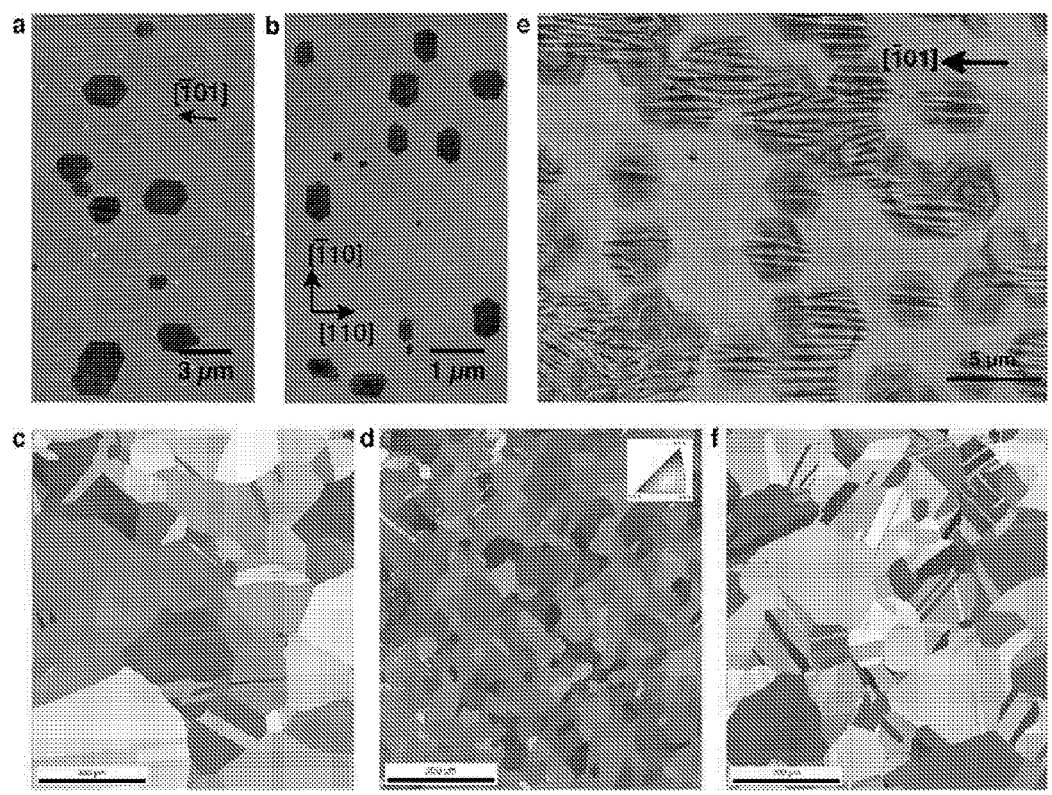
FIG. 7 illustrates the orientation dependence of hexagonal graphene domains on polycrystalline Cu: (a), (b) SEM images of APCVD hexagonal graphene domains grown on high purity (99.999%) Alfa Aesar Cu foil, showing alignment to one direction on Cu{111} and two directions on Cu{001}, respectively; (c), (d) low magnification, 1000×900 μm, surface normal-projected inverse pole figure EBSD maps of high purity (99.999%) and low purity (99.8%) Alfa Aesar Cu foil, respectively; (e), SEM image of APCVD hexagonal graphene domains grown on low purity (99.9%) Goodfellow Cu foil, showing alignment to one direction on Cu{101}; and (f) low magnification, 1000×900 μm, surface normal-projected inverse pole figure EBSD map of low purity (99.9%) Goodfellow Cu foil, showing prevalence of grains with orientation near Cu{101} and Cu{111}.

Characteristic hexagonal-shaped graphene domains were also synthesized via APCVD on high purity Cu substrates (99.999%, Alfa Aesar) and showed edge alignment parallel to <101>, in one direction on Cu{101} and Cu{111} (FIG. 7a), and in two ~90° rotated directions on Cu{001} (FIG. 7b). This is identical to the above observations for LPCVD growth. It is noteworthy that domain alignment was not immediately discernable on Cu{001} due to the six-fold symmetrical hexagonal domains orientating to the two <101> directions on this surface. Investigations were also conducted with commonly used low purity Cu foils (99.8%, Alfa Aesar) and again observed preferential alignment of the hexagonal graphene domains. On this substrate the domains showed an increased misalignment compared to high purity Cu foils, which, without wishing to be bound by theory, is believed to be due to greater topographical variations. EBSD mapping demonstrated that the high purity Cu foils contain Cu{101} and Cu{111} (FIG. 7c), while the low purity Cu foils are dominated by Cu{001} (FIG. 7d) resulting in edge alignment of hexagonal domains to two ~90° rotated directions. The abundance of Cu{001} on the low purity Cu foils explains why alignment has not been previously identified on this substrate. In comparison, distinctive edge alignment of hexagonal domains is easily identified on low purity Cu foils purchased from an alternative supplier (99.9%, Goodfellow) (FIG. 7e) due to the prevalence of large grains with orientations near Cu{111} and Cu{101} (FIG. 7f). Epitaxial growth and edge alignment is therefore observed for a wide range of synthesis pressures and with various purities of Cu foil, with the crucial requirement for alignment of domain edges to one direction being the presence of Cu grains exhibiting crystallographic orientations of Cu{101} or Cu(111).

The discovery of substrate-controlled edge alignment of hexagonal graphene domains is an important advance towards the development of high-quality, large-area CVD graphene composed of perfectly orientated hexagonal domains that merge together with ideal, low-angle, defect-free grain boundaries. It was found that epitaxial growth and alignment occurred for LPCVD and APCVD synthesis, for low purity and high purity Cu (99.8% and 99.999%), and for Cu foil sourced from two different suppliers. We therefore conclude that epitaxial growth is directly related to the crystallographic orientation of the Cu substrate, and is independent of the Cu purity and supplier.

The results presented herein demonstrate that the edges of graphene domains are aligned along specific crystallographic orientations, and it is apparent that some external factor must influence the nucleation or growth mechanism. A possible explanation for this observation is that the nucleation and growth along a specific crystallographic orientation, namely the <101>, is thermodynamically favourable. The influence of hydrogen on the reaction mechanism could also be significant. Hydrogen, acting as a catalyst, may promote growth preferentially along the <101> crystallographic orientation. Conversely, it cannot be excluded that hydrogen may act as an etchant, thereby restricting growth perpendicular to the <101> direction.

In conclusion, by comparing SEM images of the aligned graphene domains with EBSD maps of the copper substrate's crystallographic orientation, it was found that different shaped graphene domains grow on specific crystallographic orientations of copper, and that the edges of graphene domains preferentially align along the <110> direction(s) of the copper substrate, irrespective of the crystallographic orientation. TEM and SAED provide evidence that the graphene network aligns with the zigzag edge parallel to the <110> direction of the copper crystallographic orientation. Complementary computational modelling of the graphene network on copper provides further insight, with zigzag edges preferentially aligning to the <110> direction(s) on the primary crystallographic orientations of (001), (101) and (111) surfaces, supporting the experimental observations. Furthermore, spatially resolved Raman spectroscopy illustrates that the quality of graphene domains is dependent on the crystallographic orientation of the copper substrate, with the highest quality single layer graphene forming on orientations close to (111) and bilayer forming on (001). Thus, a direct link can be drawn between the atomic scale orientations of the graphene network on various orientations of copper substrates and the alignment of micron sized graphene domains.

Thus, it can be seen that the shape, orientation, edge geometry and thickness of CVD graphene domains strongly depend on the crystallographic orientation of polycrystalline Cu substrates. Graphene domains form epitaxially with macroscopic edges orienting parallel to Cu <101> direction(s). LPCVD graphene domain thickness and edge geometry are also dictated by the substrate, with high-quality single-layer graphene forming on orientations close to Cu{111} and bilayer on Cu{001}, while aligned edges exhibit zigzag geometry. APCVD hexagonal graphene domains align with edges parallel to one Cu <101> direction on Cu{111} and Cu{101}, and two directions on Cu{001}. The present invention may therefore allow for the production of uniform high-quality, large-area graphene with selected properties.

It will be understood that the present invention has been described above purely by way of example, and modification of detail can be made within the scope of the invention. Each feature disclosed in the description, and where appropriate the claims and drawings may be provided independently or in any appropriate combination.

The invention claimed is:

1. A process for producing a two-dimensional nanomaterial by chemical vapour deposition (CVD), the process comprising contacting a substrate in a reaction chamber with a first flow which contains hydrogen and a second flow which contains a precursor for said material, wherein the contacting takes place under conditions such that the precursor reacts in the chamber to form said material on a surface of the substrate, wherein the ratio of the flow rate of the first flow to the flow rate of the second flow is at least 10:1, wherein the two-dimensional nanomaterial is graphene and the precursor is a carbon precursor, and wherein the substrate is a copper substrate and at least a portion of said surface of the substrate has a crystallographic orientation of (101), (001) or (111).

2. A process according to claim 1, wherein the contacting takes place under a pressure within the reaction chamber of below 1 bar.

3. A process according to claim 1, wherein at least a portion of said surface of the substrate has a crystallographic orientation of (101).

4. A process according to claim 1, wherein said surface of the substrate is substantially fully oriented in a single crystallographic orientation.

5. A process according to claim 1, wherein:
(i) the flow rate of the first flow is 5 sccm or more; and/or
(ii) the flow rate of the second flow is 20 sccm or less.

6. A process according to claim 1, wherein:
(i) the temperature within the reaction chamber is from about 800° C. to about 1050° C.; and/or
(ii) the pressure within the reaction chamber is less than 50 Torr.

7. A process according to claim 1, wherein the substrate is pre-treated with hydrogen before contacting the substrate with the second flow.

8. A process according to claim 1, wherein the carbon precursor is methane.

9. A process according to claim 1, wherein:
(i) the graphene produced by the process is substantially monolayer or bilayer graphene; and/or
(ii) the geometry of one or more edges of the graphene is substantially zigzag or substantially armchair.

10. A process according to claim 1, wherein at least one edge of the two-dimensional nanomaterial is oriented substantially parallel to a <110> direction on a crystallographic orientation on said surface of the substrate.

11. A process according to claim 1, wherein the process further comprises forming a product comprising the two-dimensional nanomaterial.

12. A process according to claim 1, wherein the two-dimensional nanomaterial is produced by atmospheric-pressure chemical vapour deposition or low-pressure chemical vapour deposition.

13. A process according to claim 1, wherein the contacting takes place under a pressure within the reaction chamber of about 1 bar or less than about 1 bar.

* * * * *